US012029003B2

(12) United States Patent
Jorge et al.

(10) Patent No.: US 12,029,003 B2
(45) Date of Patent: Jul. 2, 2024

(54) DISAGGREGATED FAULT TOLERANT BACKPLANE

(71) Applicant: Novo Space, Co., Venice, CA (US)

(72) Inventors: Facundo Ignacio Jorge, Ciudad Autonoma de Buenos Aires (AR); Rodrigo Jesus Diez, Ciudad Autonoma de Buenos Aires (AR)

(73) Assignee: NOVO SPACE, CO., Venice, CA (US)

( * ) Notice: Subject to any disclaimer, the term of this patent is extended or adjusted under 35 U.S.C. 154(b) by 304 days.

(21) Appl. No.: 17/475,190

(22) Filed: Sep. 14, 2021

(65) Prior Publication Data

US 2022/0087045 A1 Mar. 17, 2022

Related U.S. Application Data

(60) Provisional application No. 63/080,002, filed on Sep. 17, 2020.

(51) Int. Cl.
*H05K 7/14* (2006.01)
*H02H 3/38* (2006.01)

(52) U.S. Cl.
CPC ............ *H05K 7/1459* (2013.01); *H02H 3/38* (2013.01); *H05K 7/1439* (2013.01); *H05K 7/1452* (2013.01); *H05K 7/1457* (2013.01)

(58) Field of Classification Search
CPC ...... H05K 7/14; H05K 7/1459; H05K 7/1452; H05K 7/1457; H05K 7/1439; H05K 7/1445; H02H 3/38
USPC .......................................................... 361/79
See application file for complete search history.

(56) References Cited

U.S. PATENT DOCUMENTS

| | | | |
|---|---|---|---|
| 6,489,748 B1 * | 12/2002 | Okamura | H04Q 1/155 361/88 |
| 6,737,763 B2 | 5/2004 | Liu et al. | |
| 2019/0372344 A1 * | 12/2019 | Yew Lam | G06F 13/4221 |

OTHER PUBLICATIONS

AMSAT Space Symposium—Oct. 28, 2017. Ripley, pp. 1-24.
ANSI-VITA 65-2010 Feb. 2012 OpenVPX System Specification—Section 1.3.4 Backplane Profile Topologies pp. 50-55.
ANSI-VITA 78.00-2015 SpaceVPX System—Section 1.6 Backplane Profile Topologies Apr. 2015 pp. 26-29.
ANSI-VITA 78.00-2015 SpaceVPX System—Section 3.2 Power Distribution, Apr. 2015 pp. 32 and 33.
ANSI-VITA 78.00-2015 SpaceVPX System—Section 3.6 Power Supply Select Apr. 2015, pp. 43 and 44.
(Continued)

*Primary Examiner* — Danny Nguyen
(74) *Attorney, Agent, or Firm* — Rowan TELS LLC

(57) ABSTRACT

An apparatus and a method of use are disclosed herein. The apparatus comprises a disaggregated fault tolerant backplane having a front side and a back side with at least two daughter card slots configured on the front side and configured to receive slot fanout signals over the backplane. The apparatus further comprises at least two switch boards (SBs) configured to provide electrical power to the at least two daughter card slots and at least one main fanout board (MFB) configured to send and receive SB control signals to and from the at least two SBs. The at least one MFB connects to the backplane through at least one MFB connector configured on the back side of the backplane. In one embodiment, the MFB receives control signals from the daughter card slots and sends slot fanout signals to the daughter card slots.

21 Claims, 14 Drawing Sheets

(56) References Cited

OTHER PUBLICATIONS

ANSI-VITA 78.00-2015 SpaceVPX System—Section 3.7 System Controller Select Apr. 2015 pp. 45 and 46.
Collier Charles Patrick et al: "Next Generation Space Interconnect Standard (NGSIS): A modular open standards approach for high performanceinterconnects for space", 2015 IEEE Aerospace Conference, IEEE, Mar. 7, 2015 (Mar. 7, 2015), pp. 1-11, XP032782947.
Goedeke H Scott et al: "Applying SpaceVPX modular open systems interconnect concepts", 2015 IEEE/Aiaa 34th Digital Avionics Systemsconference (DASC), IEEE, Sep. 13, 2015 (Sep. 13, 2015), XP032802109.
PCT/US2021 /050329 International Search Report and Written Opinion dated Mar. 3, 2022.
Picmgr CPCI-S.1 R1.0- cPCI Serial SpaceTM—Section 4.4.1 Dual Star Serial Interconnect Aug. 4, 2017, pp. 30 through 36.
Vita 67 Backplane Solutions, www.molex.com/link/vita67.html, pp. 1 and 2.

\* cited by examiner

DISAGGREGATED FAULT TOLERANT BACKPLANE

CROSS-REFERENCE TO RELATED APPLICATIONS

This application claims the benefit of U.S. Provisional Patent Application Ser. No. 63/080,002, filed Sep. 17, 2020, the entirety of which is incorporated herein by reference.

BACKGROUND

Many conventional high reliability systems comprise a backplane capable of connecting multiple functional modules in the form of daughter cards. These daughter cards may connect to the backplane using connectors with standardized pin assignments, so that any daughter card may plug into multiple backplane slots and function within a system formed of the backplane, all connected daughter cards, and any additional devices, such as power supplies, external devices connected to one or more daughter cards over a wired or wireless connection, etc. Control signals and power are often bused in conventional systems to simplify design and layout. However, signal and power buses are often not redundant. If signaling connections and power connections are not redundant, faults in control and power buses may seriously impact the whole system, making the system susceptible to single point of failure.

Some standards (such as Vita 78 SpaceVPX) propose fault tolerant solutions that replace signal and power buses with point-to-point power, control, and/or data connections, and the addition of redundant modules with cross-strapping connections between them. To maintain as much similarity to previous versions of the standards as possible these solutions may push the complexity of some of these changes to a dedicated utility module that is in essence a daughter card dedicated to implementing the power and control signal fanout from a single source to the number of modules that source is designed to drive. (When no additional context is provided, module in this document refers to an electronic board in an individual backplane slot connected to other modules through the backplane.)

The utility modules described above support a fixed number of slots. For example, a module may be designed to support five slots in a backplane. Thus, if it is desired to connect another module to the backplane, an additional slot may be dedicated to a power module designed to support five times as many modules as the one to be added, making this solution inefficient when not all slots supported by the module are in use. Similarly, scalability of systems relying on these utility modules lacks granularity. The addition of one module more than is supported by existing utility modules in the system necessitates adding an entire additional utility module.

Utility modules conventionally involve complex mixed board designs that handle digital signals and high-current switching. High ounce copper layers may be needed to implement high current lines, compared to signal traces that may be narrower and implemented with thinner copper layers. In design and fabrication, mixing high current lines and signal traces often results in signal traces needing to be etched from high ounce copper, and thus needing to be both thicker than is electrically needed, and wider, as high ounce copper etching cannot be accomplished at as fine a pitch as etching on thinner layers. Thus for mixed signal boards, the ability to route a high number of digital, low current signals is limited, while more expensive, high ounce layers may be used to a greater extent than is needed. Separating high current lines, and thus high ounce copper layers, on designated boards while allowing thinner layers and finer pitch routing on separate signal boards may be more cost-effective.

There is, therefore, a need for a more modular, more granularly scalable configuration that avoids mixed power and signal board design and is thus a more cost effective solution. Such a solution needs to better separate high current and low current circuitry for improved fault tolerance and provide point-to-point power and signaling without additional design routing complexity and area.

BRIEF SUMMARY

In one aspect, an apparatus includes a disaggregated fault tolerant backplane having a front side and a back side, where at least two daughter card slots are configured on the front side and are configured to send and receive slot fanout signals over the disaggregated fault tolerant backplane, at least two switch boards (SBs) configured to provide electrical power to the at least two daughter card slots via slot power rails, where the at least two SBs connect to the disaggregated fault tolerant backplane through at least two SB connectors configured on the back side of the disaggregated fault tolerant backplane, and at least one main fanout board (MFB) configured to send and receive SB control signals to and from the at least two SBs, where the at least one MFB connects to the disaggregated fault tolerant backplane through at least one MFB connector configured on the back side of the disaggregated fault tolerant backplane.

In one aspect, a method includes configuring a front side of a backplane with at least two daughter card slots, configuring a back side of the backplane to connect to at least two switch boards (SBs) through at least two SB connectors, the SBs configured to provide power to the at least two daughter card slots through at least two slot power rails, configuring the back side of the backplane to connect to at least one main fanout board (MFB) through at least one MFB connector, the at least one MFB configured to enable and supervise the at least two SBs, installing the at least two SBs on the back side of the backplane, installing the at least one MFB on the back side of the backplane, and installing the backplane, the at least two SBs, and the at least one MFB, in a chassis, the chassis configured to protect and support the backplane, the at least two SBs, and the at least one MFB.

In one aspect, an apparatus includes a backplane having a front side and a back side, the backplane includes a nominal power rail providing electrical power to the backplane, at least two slot power rails, at least two switch board (SB) connectors configured on the back side, each connected to the nominal power rail and to one of the slot power rails, and at least two daughter card slot connectors configured on the front side, each connected to one of the slot power rails and to backplane electrical signals. The apparatus also includes at least two switch boards (SBs) configured to connect to the backplane through the SB connectors, each SB includes SB nominal power, SB output power, an SB backplane connector connected to the SB nominal power and the SB output power and configured such that mating the SB backplane connector with one of the SB connectors attaches the nominal power rail to the SB nominal power and attaches the SB output power to one of the slot power rails, at least one nominal SB switch enable, and at least one nominal power fault tolerant blocking switch configured to connect the SB nominal power to the SB output power when closed by the at least one nominal SB switch enable, thereby conveying the electrical power from the nominal power rail to one of the at least two daughter card slot connectors.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

The disclosed solution provides fault isolation with a disaggregated and distributed solution that provides an improvement in overall system size, scales linearly with the number of slots, and reduces the complexity of individual parts of the system, allowing easier testing, manufacturing, and servicing.

To remove any credible single point of failure in the system, buses are replaced with point to point connections. To facilitate this, the bused power distribution system may be supplemented with a number of individual power switches, each associated with an individual slot in the backplane. The control signals may be connected to an independent module that performs the fanout to each slot and isolates each section in the case of a fault.

Figure 2:
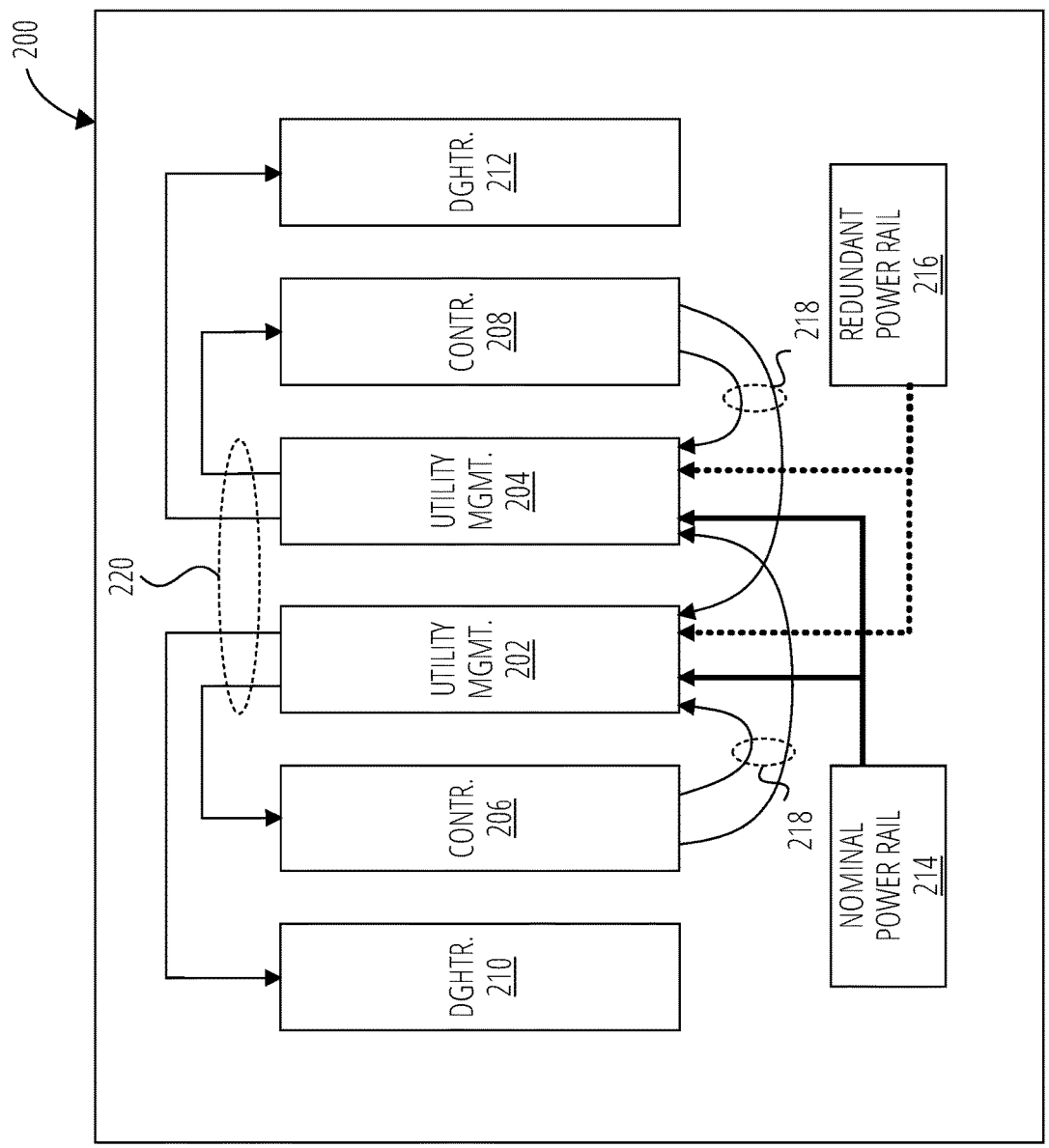
FIG. 2 illustrates a Vita 78 SpaceVPX backplane 200.
Figure 12:
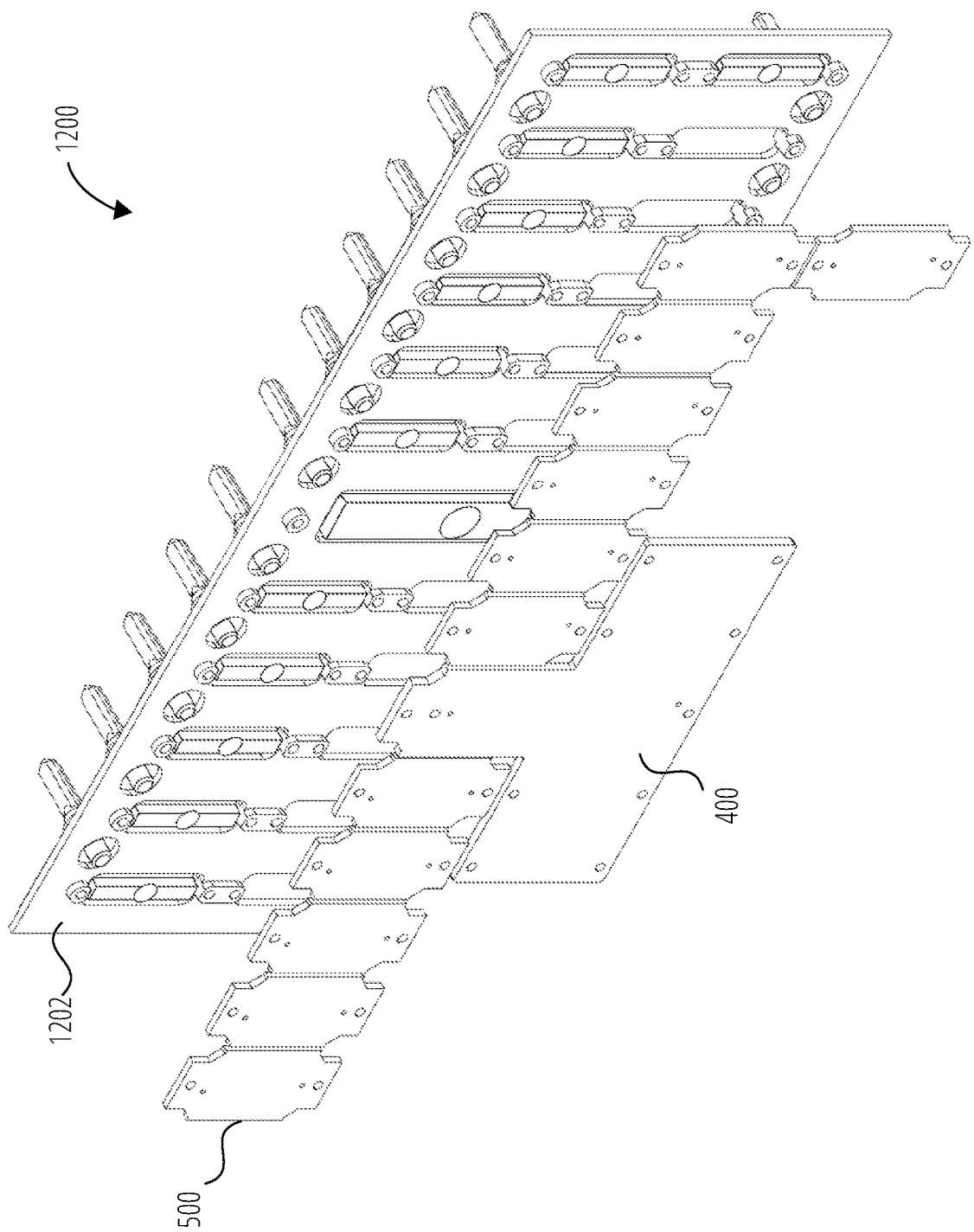
FIG. 12 illustrates an eleven slot disaggregated fault tolerant backplane assembly 1200 in accordance with one embodiment.

Unlike other solutions (Vita 78 SpaceVPX example), these improvements are implemented with distributed modules connected on the back of the backplane (See FIG. 6-FIG. 10) instead of a complex integrated solution in one individual slot (such as is illustrated in FIG. 2). Slot-associated switching may be performed with switch boards (SBs) and signal fanout with the main fanout boards (MFBs). Each MFB may support a high number of SBs. In one embodiment, the MFB supports up to twelve SBs, which allows six fully redundant slots (2×6=12 slots), or five fully redundant slots with an ad hoc double SB slot (2×5+1=11 slots, as illustrated in FIG. 12).

This system is implemented using at least one SB per backplane slot. The SBs may be implemented in an independent module which performs the power switching of all the power rails needed for each slot. The power rail set for the slot may be selectable between one set of the redundant power rails, i.e., either nominal power or redundant power, both nominal and redundant power, and neither (off). (See FIG. 5.) The SB ensures fault isolation between power rails, and no single failure may propagate between power rails sets (nominal/redundant). The redundant power may be functionally equivalent to the nominal power, such that in case of failure of the nominal power, the apparatus and the daughter cards continue to function without interruption.

The MFB functionality may be implemented in two separate boards (one for nominal slots and the other for redundant ones). However, this takes more physical space for the connectors in the back of the backplane (see FIG. 10) than for a single board solution. Using two connectors may necessitate a bigger backplane, resulting in an overall larger system volume. Additionally, a two-board solution makes the introduction of switches and cross-strapping for slot fanout signals in the MFB difficult.

In one embodiment, the MFB may be fully redundant within the board (connector failure is considered non-credible), allowing the implementation of cross-strapping of slot fanout signals and MFB and SB control signals if this implementation is needed, maintaining a reduced overall system size (volume). (See FIG. 4.) Optionally, in some cases, a single high reliability device may be used for the signal fanout if aggressive size reduction is needed, at the cost of introducing a single point of failure to the system.

The SB and MFB modules may be connected into the backside of the backplane via a connector, or alternatively, they may be soldered into a Ball Grid Array (BGA) or similar footprint. If soldered as a BGA, the SBs and MFB care may need to be taken to observe the printed circuit board (PCB) real estate available, as no components may be placed on the bottom side of the modules. Both types of modules may need to observe this consideration, as the volume is optimized when both modules share the same stacking height or BGA mounting mechanism. BGA footprint and soldering may be a preferred implementation when aggressive volume savings are needed. When serviceability and ease of manufacturing is prioritized, a preferred embodiment of the solution may use BGA connectors with a height as low as allowed by components on the bottom side of both the SB and the MFB. In some embodiments, the SB functionality may be deployed in components incorporated directly on the backplane.

SBs modules may be located physically between slots on the back of the backplane. The middle section (notionally, between the redundant controllers) may be reserved for the MFB. The SB mounting strategy may need the board to be rotated to enable reuse of the same SB board design. This may be avoided if the SB design uses a PCB centered connector (see FIG. 7, FIG. 9, and FIG. 10). Preventing both power rails to be selected at the same time may prevent the occurrence of an event affecting both rails simultaneously. In one embodiment, local current and voltage measurements may allow the MFB to supervise the slot power. (See FIG. 5.)

The MFB may be placed close to the middle of the backplane to ease backplane routing (one side of the backplane is assumed nominal, the other side redundant). Local watchdog/supervision may be placed on the MFB to allow recovery and automatic switchover in case of controller fault (see FIG. 4).

Figure 1:
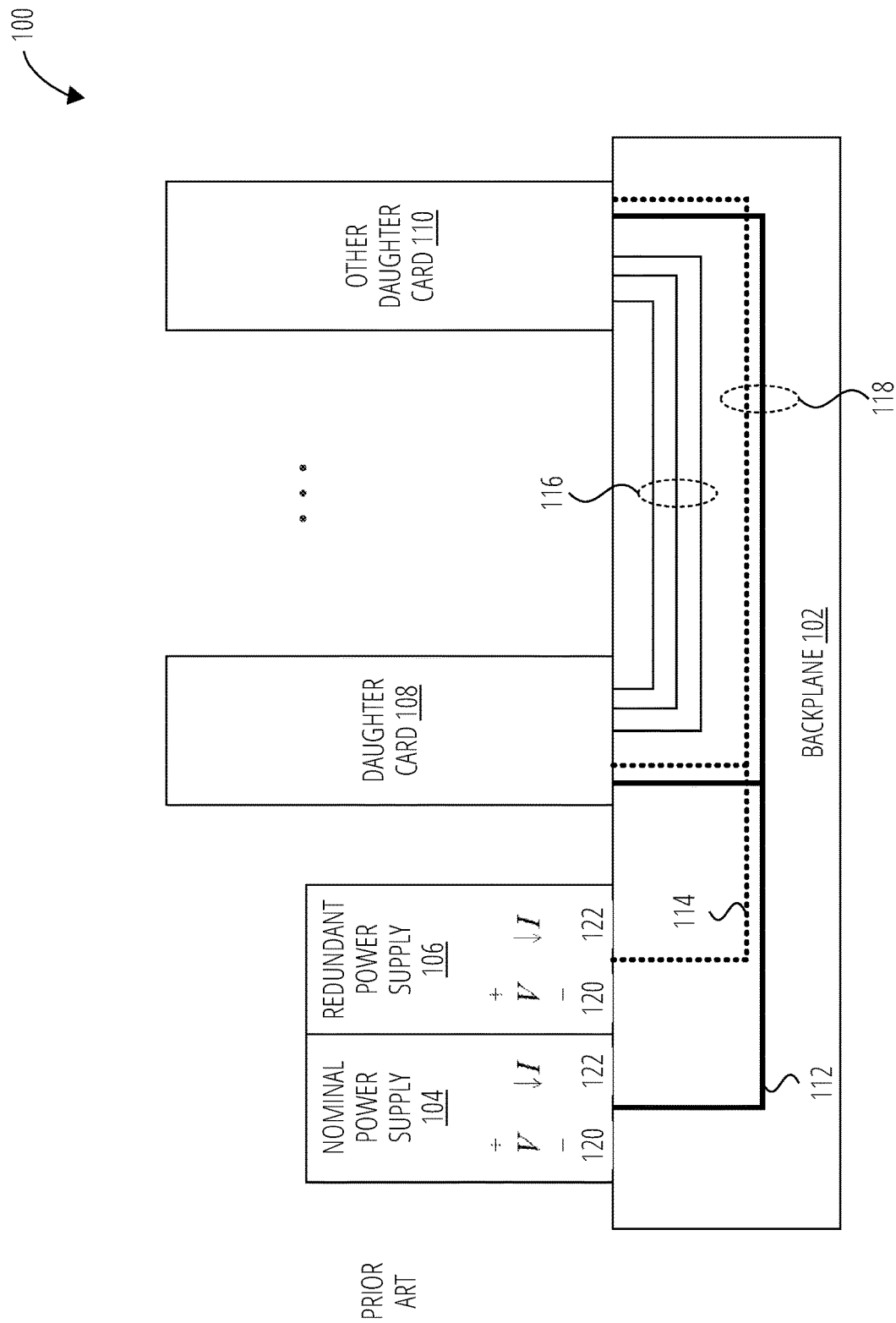
FIG. 1 illustrates a redundant power backplane system 100.

FIG. 1 illustrates a redundant power backplane system 100 in its simplest form. The redundant power backplane system 100 may comprise a backplane 102, a nominal power supply 104, a redundant power supply 106, a daughter card 108, and an other daughter card 110.

Use of a backplane 102 may permit a modular design, such that power supplies and multi-functional daughter cards may be connected flexibly within a system. Each of the nominal power supply 104 and redundant power supply 106 may be designed to provide a specified voltage 120 and a specified current 122 interchangeably, such that the redundant power backplane system 100 may operate as intended whether both or one of the power supplies is functional. Connection of the nominal power supply 104 and redundant power supply 106 to the backplane 102 may supply power to nominal power 112 and redundant power 114 layers or buses configured within the backplane 102. These layers or busses may in turn provide electrical power 118, whether nominal power 112 or redundant power 114, to the daughter cards connected to the backplane 102 as shown.

Backplanes 102 are conventionally constructed from multi-layer PCBs. In some cases, electrical power 118 such as nominal power 112 and redundant power 114, as well as a system ground, are electrically connected to an uninterrupted or minimally interrupted metal layer within the PCB, such that bused power is unsusceptible to single points of failure. Multiple pins on connectors (not shown) that connect the nominal power supply 104, redundant power supply 106, daughter card 108, and other daughter card 110 to the backplane 102 may be configured to carry power and ground from supplies to cards, such that the failure of any one pin may not disrupt the functioning of the system.

Signal traces configured in the backplane 102 may transmit electrical signals 116 between the daughter card 108 and other daughter card 110 as shown, allowing each card to communicate with all others in the redundant power backplane system 100. These signal traces may be isolated from power in many conventional embodiments by configuring signals on layers of the PCB that are insulated from power layers, or through physical horizontal distance between traces within a PCB layer.

Such a backplane 102 may be used to construct high reliability computing systems, providing multiple sources of system power to redundant daughter cards. In this manner, failure in any one system component may be prevented from disrupting the function of the system overall. Such highly reliable redundant power backplane systems 100 may be further refined as disclosed herein for improved modularity of design, allowing higher fault tolerance, simplified signal routing, and easier maintenance.

FIG. 2 illustrates a Vita 78 SpaceVPX backplane 200, providing an example of a conventional high reliability system. The Vita 78 SpaceVPX backplane 200 comprises a utility management slot 202, a utility management slot 204, a controller slot 206, a controller slot 208, a daughter card slot 210, a daughter card slot 212, a nominal power rail 214, and a redundant power rail 216.

The redundant power rails nominal power rail 214 and redundant power rail 216 connect to independent power supplies (not shown) through stubs, connectors, or use of dedicated power supply slots. Nominal power rail 214 and redundant power rail 216 carry nominal and redundant power over the Vita 78 SpaceVPX backplane 200.

Where there is a dedicated redundant slot for power and digital signals fanout (called Space Utility Management or UM in Vita 78 SpaceVPX), the nominal power rail 214 and redundant power rail 216 may connect to utility management slot 202 and utility management slot 204. The utility management modules in the utility management slot 202 and utility management slot 204 may accept digital control signals 218 from chassis or backplane controllers, or control modules connected to the controller slot 206 and controller slot 208. The utility management modules in utility management slot 202 and utility management slot 204 may in turn provide point-to-point power and digital signals 220 from the UM modules to each slot of the Vita 78 SpaceVPX backplane 200, including controller slot 206, controller slot 208, daughter card slot 210, and daughter card slot 212.

In some configurations, utility management slot 202, controller slot 206, and daughter card slot 210 may run primarily off of nominal power on nominal power rail 214, while utility management slot 204, controller slot 208, and daughter card slot 212 are configured to run off of redundant power on redundant power rail 216. In case of a fault anywhere in nominal power-related electronics, a functionally equivalent set of electronics may be available to take over while running on independent and isolated redundant power. The disclosed solution, described in detail below, may provide the functionality and reliability accordant with a Vita 78 SpaceVPX backplane 200, with improved robusticity of power management components, as well as simplified signal routing on the backplane and easier maintenance and repair.

Figure 3:
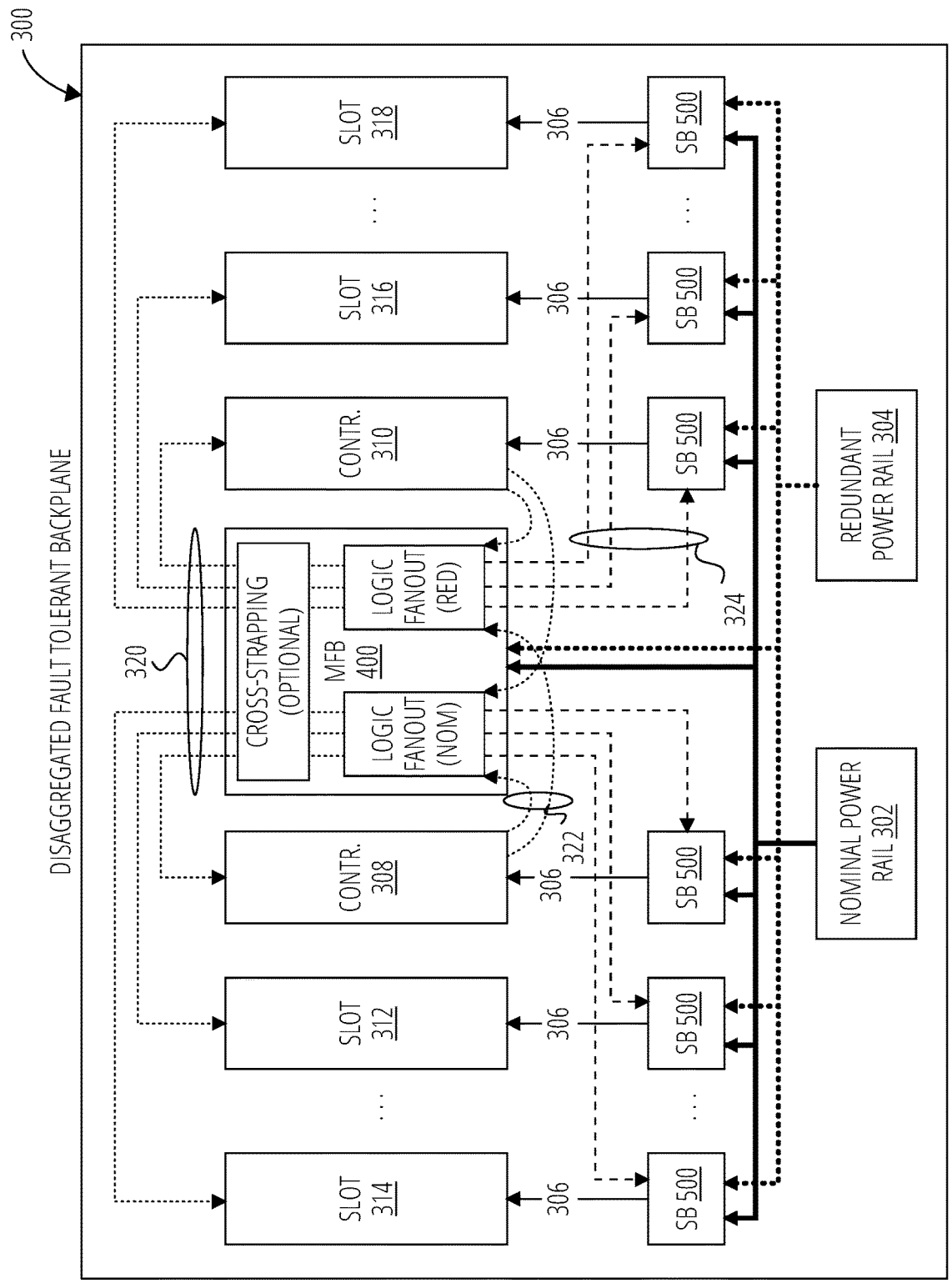
FIG. 3 illustrates a disaggregated fault tolerant backplane 300 in accordance with one embodiment.

FIG. 3 illustrates a disaggregated fault tolerant backplane 300 in accordance with one embodiment. The disaggregated fault tolerant backplane 300 comprises nominal power rail 302, redundant power rail 304, slot power rail 306, controller daughter card slot 308, controller daughter card slot 310, daughter card slot 312, daughter card slot 314, daughter card slot 316, and daughter card slot 318. The disaggregated fault tolerant backplane 300 is configured to connect to a main fanout board 400 and one switch board 500 for each daughter card slot.

The nominal power rail 302 and redundant power rail 304 implemented on the disaggregated fault tolerant backplane 300 may be as described with respect to nominal power 112, redundant power 114, nominal power rail 214, and redundant power rail 216, introduced in FIG. 1 and FIG. 2. In one embodiment, each power rail may carry a specified voltage and a specified current, which combine to indicate a rated wattage. For example, a voltage of positive twelve volts (+12V) may be provided, with a current capability of fifty amperes (50A), on each power rail. Thus, the nominal power rail 302 and redundant power rail 304 may each deliver a total of 600 W to power the system. In one embodiment, the nominal power rail may carry enough power to support the function of the controller daughter card slot 308, daughter card slot 312, daughter card slot 316, and intervening slots between 312 and 316 as indicated by the ellipses. Likewise, the redundant power rail may be able to support controller daughter card slot 310 and daughter card slot 314-316 and no other slots. In other embodiments, each of the nominal power and redundant power rails may be capable of supporting functionality of all of the slots in the system at once.

Rather than connecting directly to all daughter card slots as shown in FIG. 1 or connecting to utility management slots such as 202 and 204 and fanning out to daughter card slots from there as shown in FIG. 2, the disaggregated fault tolerant backplane 300 may integrate with switch boards 500 configured to provide power to independent slot power rails 306 for a slot each switch board 500 is associated with. The switch boards 500 may be supervised and controlled by a main fanout board 400. In this manner, power management may be disaggregated from utility management modules, and managed modularly across devices distributed on the disaggregated fault tolerant backplane 300.

The main fanout board 400 (MFB) implements redundant logic fanout for the control signals. These slot fanout signals 320 are shown as narrow, angled dotted lines. In one embodiment, half of the daughter card slots in a disaggregated fault tolerant backplane 300 may be identified as nominal slots, operating primarily on nominal power. In FIG. 3, these nominal slots are represented by controller daughter card slot 308, daughter card slot 312, and daughter card slot 318. Slot fanout signals 320 to these daughter cards may be managed by a nominal logic fanout controller, described in greater detail with respect to FIG. 4. The other daughter card slots of the disaggregated fault tolerant backplane 300, i.e., controller daughter card slot 310, daughter card slot 316, and daughter card slot 318, may receive slot fanout signals 320 managed by a redundant logic fanout controller, also described with respect to FIG. 4. The slot fanout signals 320 may include supervision and utility interface signals set forth in the standard for Vita 78 SpaceVPX systems. In conventional SpaceVPX systems, these signals may be implemented using signal buses and clock distribution within the backplane. MFB control signals 322, indicated by narrow, curved dotted lines, may similarly be received by each of the nominal logic fanout controller and the redundant logic fanout controller from the slots managed by that fanout controller. In some embodiments, card slots intended for use as part of the nominal portion of the system may send MFB control signals 322 to the redundant logic fanout controller, and vice versa, as shown. Cross-strapping circuitry may be employed on the main fanout board 400 (described in greater detail below). This allows the nominal slots to be managed by the redundant logic fanout controller and vice versa to provide additional robusticity against points of failure.

In one embodiment, each logic fanout controller also manages the switch board 500 (SB) configured to power the slots that logic fanout controller manages. Additionally, the main fanout board 400 may be fault tolerant and have no credible single point of failure. (Connector failure is deemed non-credible.) Each main fanout board 400 may support many slot/switch board 500 through the MFB control signals 322 received from the slots, the slot fanout signals 320 sent to the slots, and the SB control signals 324 sent to the switch boards 500. By supporting this logic on the main fanout board 400, the disclosed system may eliminate the need for a dedicated UM daughter card, allowing more room in the system for cards performing other functions, or allowing equivalent functionality to be performed by a physically smaller system.

SB control signals 324 may be transmitted over the disaggregated fault tolerant backplane 300 to each switch board 500 from the main fanout board 400. This digital signaling interface may include the enable signals for power switching and selection on the switch boards 500, as well as a point-to-point supervision interface (such as SPI or I2C) providing local telemetry (voltage and currents) from the switch boards 500 to supervisory circuits on the main fanout board 400. An independent set of slot fanout signals 320, MFB control signals 322, and SB control signals 324 are needed to support each slot and its associated switch board 500. Each main fanout board 400 may support many slot/switch board 500 pairs.

In one embodiment of the redundant power disaggregated fault tolerant backplane system, SB control signals 324 may be provided by designated controller daughter cards, such as those that may be inserted into the system via controller daughter card slots 308 and 310. In this embodiment, an MFB may not be present. The daughter cards may be configured to control an SB for each slot on the backplane and manage the slot fanout signals 320 without the aid of the main fanout board 400.

Figure 4:
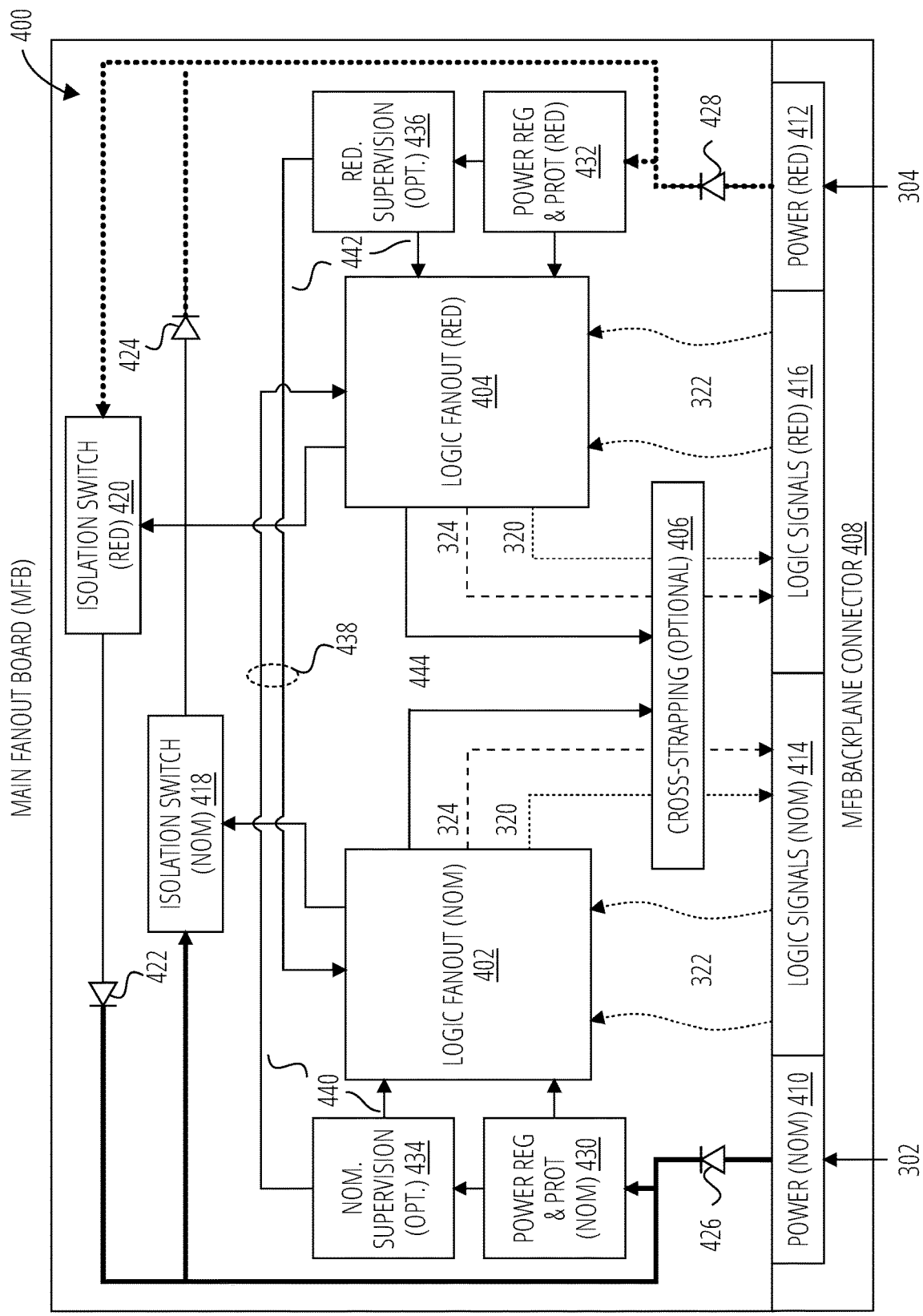
FIG. 4 illustrates a main fanout board 400 in accordance with one embodiment.

FIG. 4 illustrates a main fanout board 400 in accordance with one embodiment. The main fanout board 400 comprises a nominal logic fanout controller 402, a redundant logic fanout controller 404, optional cross-strapping circuitry 406 in some embodiments, an MFB backplane connector 408, a nominal isolation switch 418, a nominal isolation diode 422, a redundant isolation switch 420, a redundant isolation diode 424, a nominal power regulator and nominal power protection 430, a redundant power regulator and redundant power protection 432, and, in some embodiments, an optional nominal supervision circuit 434 and an optional redundant supervision circuit 436.

The main fanout board 400 is a fully redundant system with a nominal logic fanout controller 402 and a redundant logic fanout controller 404. In some embodiments, the nominal logic fanout controller 402 and redundant logic fanout controller 404 may be implemented as a single fanout device (high pin count device such as Field Programmable Gate Array—FPGA or System on Chip—SoC). The nominal logic fanout controller 402 and redundant logic fanout controller 404 may alternatively be implemented using two such devices. In another embodiment, nominal and redundant power may not be supported, and a single fanout device may be implemented to fan signals out to slots without separation in to nominal and redundant signal sets. Thus, while the illustrated embodiment shows two such fanout devices, single logic fanout controller may be used to implement the disclosed solution.

The fanout device(s) may interface with redundant controller slots through MFB control signals 322 and fanout to these interfaces with point to point connections to all the remaining slots through slot fanout signals 320. The fanout device(s) may further provide power enable as well as optional supervision to the SBs through SB control signals 324. These devices may support a high number of slots using a single main fanout board 400. In one embodiment, the main fanout board 400 may support up to 6 fully redundant slots/SBs (for a total of twelve SB/slot pairs, six nominal and six redundant). Each side of the redundancy may be connected to the associated power rail (nominal to nominal, redundant to redundant).

The main fanout board 400 further comprises an MFB backplane connector 408. The MFB backplane connector 408 allows the main fanout board 400 to connect to a disaggregated fault tolerant backplane 300 as introduced in FIG. 3. The MFB backplane connector 408 and a corresponding MFB connector (not shown) on the disaggregated fault tolerant backplane 300 may provide power from the nominal power rail 302 to the MFB nominal power 410 and from the redundant power rail 304 to the MFB redundant power 412. MFB nominal signals 414 and MFB redundant signals 416 may also travel between the main fanout board 400 and the disaggregated fault tolerant backplane 300 by way of the MFB backplane connector 408 and the MFB connector on the disaggregated fault tolerant backplane 300.

These signals may include the slot fanout signals 320, MFB control signals 322, and SB control signals 324 introduced with respect to FIG. 3.

Nominal main fanout board 400 circuitry, such as the nominal logic fanout controller 402 and optional nominal supervision circuit 434, may be intended to draw power from the MFB nominal power 410 through a nominal power regulator and nominal power protection 430. The nominal power regulator may transform the power on MFB nominal power 410 to a different voltage for use on digital circuitry operating at some level other than is provided directly from the power supplies. For example, nominal power may be provided at +12V, while the FPGAs, SoCs, and/or uCs used to implement the nominal logic fanout controller 402 and optional nominal supervision circuit 434 operate using +5V or +3.3V. Nominal power protection may prevent overvoltage conditions from static discharge, short circuits, or other power faults on the MFB nominal power 410. These functions are well understood by those skilled in the art. The redundant logic fanout controller 404 and optional redundant supervision circuit 436 may similarly be configured to draw power from the MFB redundant power 412 through a redundant power regulator and redundant power protection 432 in the same manner.

A nominal isolation switch 418 and redundant isolation switch 420 may be provided as illustrated and may be controlled by the nominal logic fanout controller 402 and redundant logic fanout controller 404 respectively.

In case of a failure of power on the nominal power rail, the system may be designed to be powered by redundant power in its entirety. In such an event, the nominal isolation switch 418 may be placed in an open state and the redundant isolation switch 420 closed, allowing the MFB redundant power 412 to power the nominal logic fanout controller 402, nominal power regulator and nominal power protection 430, and optional nominal supervision circuit 434.

Similarly, the system may be configured to be powered by nominal power in its entirety. In this event, the nominal isolation switch 418 may be closed and the redundant isolation switch 420 opened to provide MFB nominal power 410 to the redundant logic fanout controller 404, redundant power regulator and redundant power protection 432, and optional redundant supervision circuit 436.

A nominal isolation diode 422 blocks current flow from the MFB nominal power 410 to the redundant power rail when the redundant isolation switch 420 is closed. A redundant isolation diode 424 blocks current flow from the MFB redundant power 412 to the nominal power rail when the nominal isolation switch 418 is closed.

A nominal rail blocking diode 426 blocks current flow from the MFB redundant power 412 to the nominal power rail when the redundant isolation switch 420 is closed. A redundant rail blocking diode 428 blocks current flow from the MFB nominal power 410 onto the redundant power rail when the nominal isolation switch 418 is closed.

In some embodiments, optional cross-strapping circuitry 406 may be included, allowing the redundant logic fanout controller 404 a path to provide MFB nominal signals and vice versa, for additional fault tolerance. The optional cross-strapping circuitry 406 may be controlled by cross-strapping circuitry controls 444 from the nominal logic fanout controller 402 and the redundant logic fanout controller 404. The main fanout board 400 may further include optional supervision, such as optional nominal supervision circuit 434 and optional redundant supervision circuit 436, to increase reliability and perform switchover if the application demands it. An additional supervisory cross-strapped interface 438 may provide watchdog capabilities to the fanout device or devices through nominal supervisory signals 440 and redundant supervisory signals 442. Optional nominal supervision circuits 434 and optional redundant supervision circuits 436 may be implemented using a supervisory microcontroller (uC) or SoC. These supervisor circuits may additionally provide switchover logic and power enable logic for backplane direct current (DC) converters that generate the local power rails.

Figure 5:
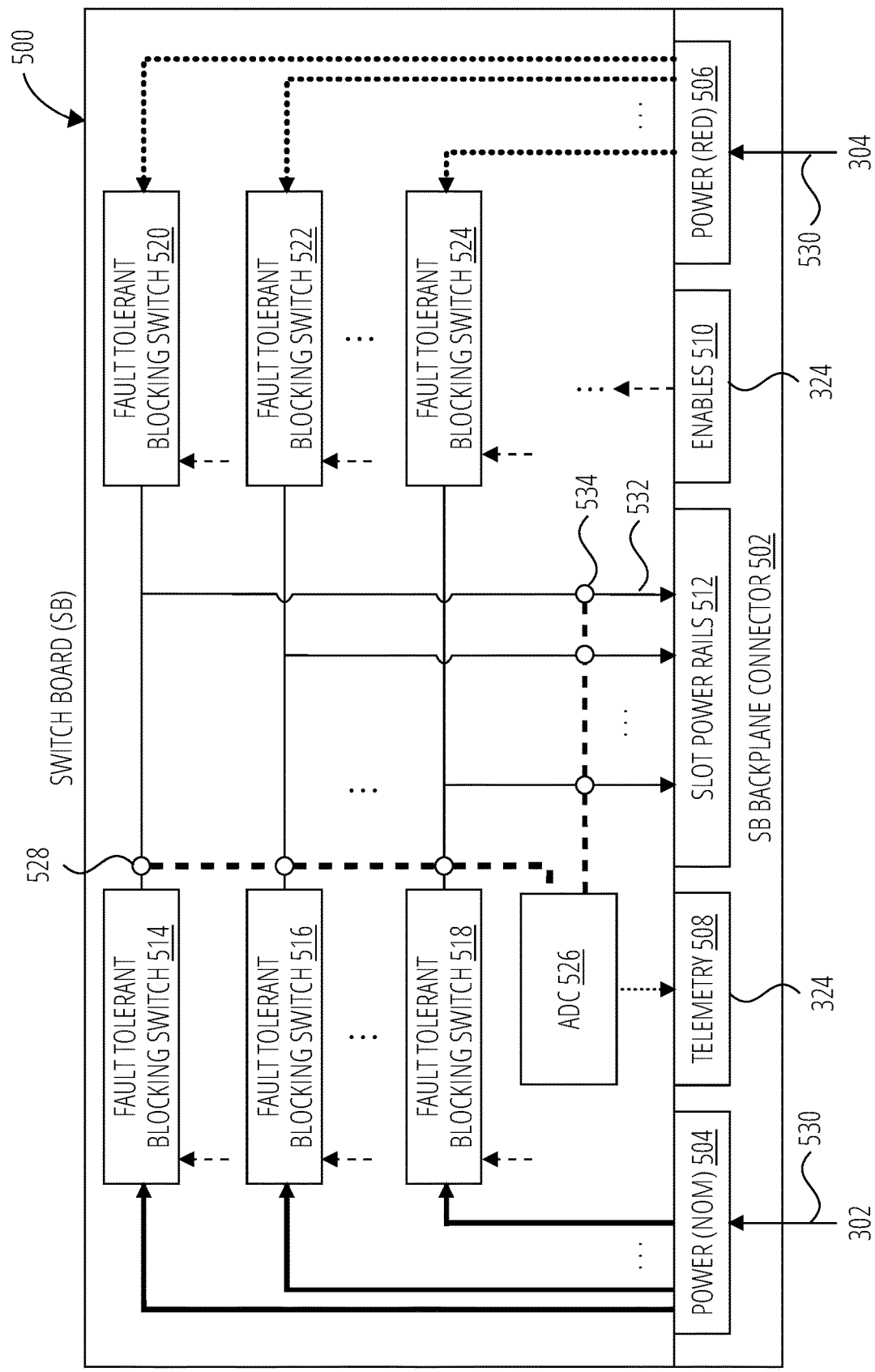
FIG. 5 illustrates a switch board 500 in accordance with one embodiment.

FIG. 5 illustrates a switch board 500 in accordance with one embodiment. The switch board 500 comprises an SB backplane connector 502, nominal power fault tolerant blocking switches 514-518, redundant power fault tolerant blocking switches 520-524, and an analog to digital converter 526.

The SB backplane connector 502 may be configured to mate with an SB backplane connector (not shown) installed on the disaggregated fault tolerant backplane 300, providing connectivity between the switch board 500 and the disaggregated fault tolerant backplane 300. In this manner, the SB nominal power 504 and SB redundant power 506 receive input electrical power 530 from nominal power rail 302 and redundant power rail 304 respectively, SB switch enables 510 are provided in the SB control signals 324 from the main fanout board 400, telemetry 508 is provided from the analog to digital converter 526 to the main fanout board 400, and slot power rails 512 on the switch board 500 may provide SB output power 532 to the slot power rails 306 introduced in FIG. 3 and powering a daughter card slot associated with each switch board 500.

The primary features of the switch board 500 are the fault tolerant blocking switches that allow power selection. There may be switch set (one connected to the nominal voltage rail, and one to the redundant) on each rail needed to power a slot. This switching may be implemented with back to back P MOSFETs or other special purpose devices, including mechanical relays. One embodiment may utilize MOSFETs or other low impedance solid state switches. Switch enabling may be provided on the SB switch enables 510 using SB control signals 324 from the main fanout board 400. When nominal power fault tolerant blocking switch 514, nominal power fault tolerant blocking switch 516, and nominal power fault tolerant blocking switch 518 are enabled or closed, input electrical power 530 may be routed from the SB nominal power 504 to the slot power rails 512, such that the SB output power 532 to the associated slot is driven by nominal power. Likewise, when redundant power fault tolerant blocking switch 520, redundant power fault tolerant blocking switch 522, and redundant power fault tolerant blocking switch 524 are enabled or closed, input electrical power 530 on the SB redundant power 506 may be used to drive the SB output power 532 on the slot power rails 512, powering the associated slot from redundant power.

In one embodiment, the switch board 500 may include local supervision for the power (voltage and current) delivered to the slot. The switch board 500 module may be primarily an analog power board that provides the power switching/selection functionality for each slot. In one embodiment, the board includes current and voltage measurements for each power rail. Current and voltage measurements for slot supervision may be implemented on the switch board 500 to assist housekeeping and fault detection. The measurements may be performed by an analog to digital converter 526 (ADC) configured to accept input from voltage sensing 528 and current sensing 534 components or using a specialized device. The ADC 526 or specialized device may allow telemetry 508 to be gathered on voltage and current consumption of the associated slot. This information may be used later for fault identification, protection, and response purposes. Telemetry 508 data may be sent to the main fanout board 400 as part of the SB control signals 324 between the main fanout board 400 and switch board 500.

In one embodiment of the redundant power disaggregated fault tolerant backplane system, SB control signals 324 such as telemetry 508 and SB switch enables 510 may be provided by designated controller daughter cards, such as those that may be inserted into the system via controller daughter card slots 308 and 310. In this embodiment, an MFB may not be present. The daughter cards may be configured to control an SB for each slot on the backplane and manage the slot fanout signals 320 without the aid of the main fanout board 400.

FIG. 6 to FIG. 10 illustrate the general arrangement of the PCBs that comprise the assembly. Mechanical parts such as mounting frames, standoffs, washers, nuts, and screws have been removed for clarity.

Figure 6:
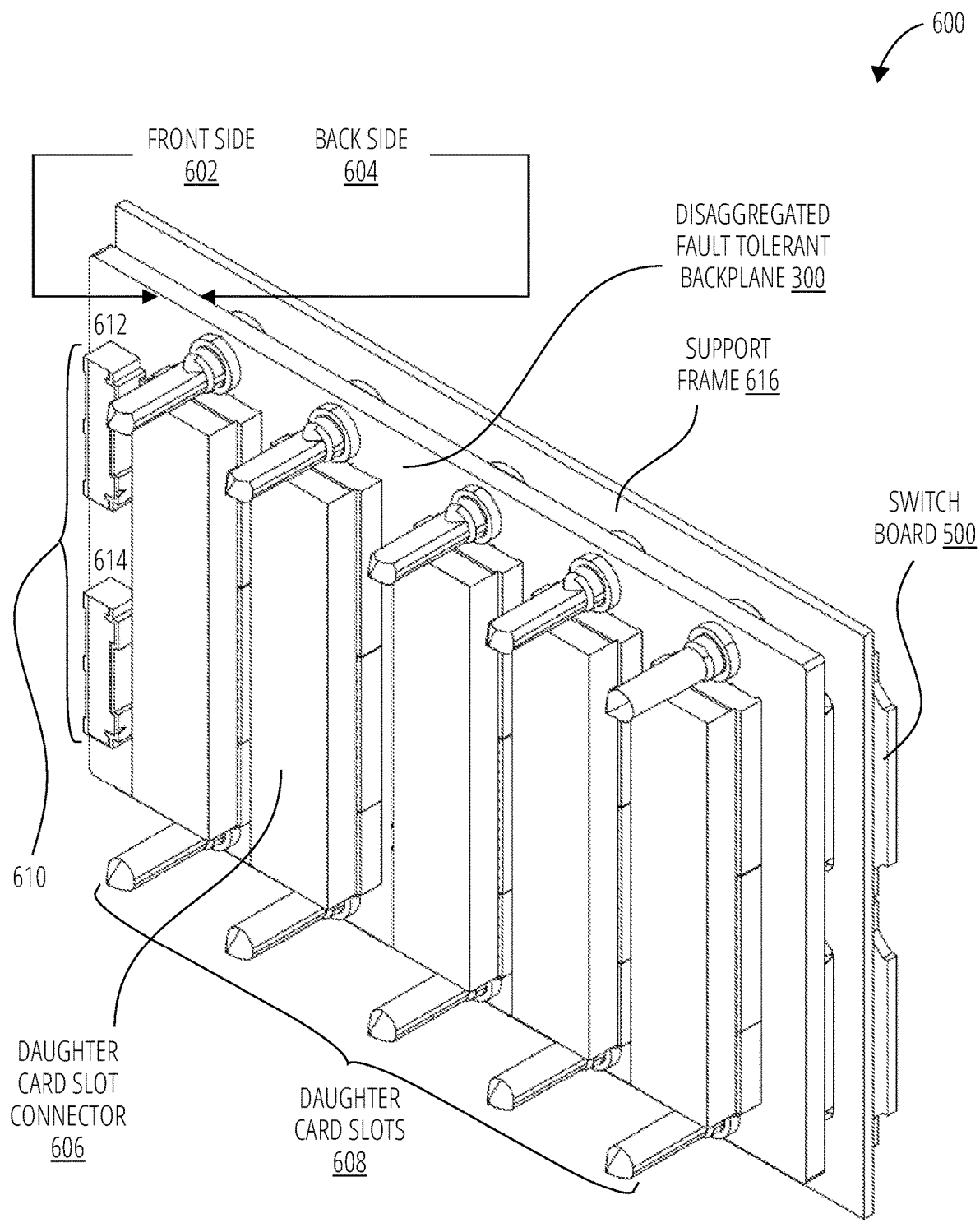
FIG. 6 illustrates a front view of a disaggregated fault tolerant backplane assembly 600 in accordance with one embodiment.

FIG. 6 illustrates a front view of a disaggregated fault tolerant backplane assembly 600 in accordance with one embodiment. The disaggregated fault tolerant backplane assembly 600 comprises a disaggregated fault tolerant backplane 300 having a designated front side 602, at least one main fanout board 400, and a plurality of switch boards 500.

The front side 602 of the disaggregated fault tolerant backplane 300 is considered the side where daughter cards plug into the system at the daughter card slots 608 via the daughter card slot connectors 606. The daughter card slots 608 provide a standard interface for daughter boards designed appropriately per backplane standards. This example shows a five slot 3U SpaceVPX type backplane, but similar form factors with four or more slots s (and other 3U based backplanes, such as VPX, Compact PCI, Compact PCI serial, VNX, and other backplane standards).

The backplane power connectors 610 show a possible implementation of the redundant power supply input to the disaggregated fault tolerant backplane 300. In some embodiments, the backplane power connector 610 may be located on the front side 602 as shown. One of the backplane power connectors 610 may be a backplane nominal power connector 612 connecting a nominal power supply, such as the nominal power supply 104 introduced in FIG. 1, to the disaggregated fault tolerant backplane 300. The other may be a backplane redundant power connector 614 connecting a redundant power supply, such as the redundant power supply 106 introduced in FIG. 1, to the disaggregated fault tolerant backplane 300.

Connectors for the main fanout board 400 and switch boards 500 may be located on the back side 604. In other embodiments, the connections to sources for nominal power and redundant power may be configured in some other manner and in some other location. In the illustrated embodiment, the backplane has redundant power rails, but the system may also implement a single power rail configuration (without single point of failure tolerance), allowing fault isolation by turning off affected daughter card slots 608 using the associated switch boards 500.

A support frame 616 may be disposed between the disaggregated fault tolerant backplane 300 and the main fanout board 400 and switch boards 500. The support frame 616 in some embodiments may be made of aluminum and may be fixed to the disaggregated fault tolerant backplane 300, main fanout board 400, and switch boards 500 with screws or other mounting hardware. The support frame 616 may also be fixed to a chassis (not shown). In this configuration, the support frame 616 may prevent the main fanout board 400 and switch boards 500 from disconnecting from the disaggregated fault tolerant backplane 300 under conditions of extreme shock or vibration.

Figure 7:
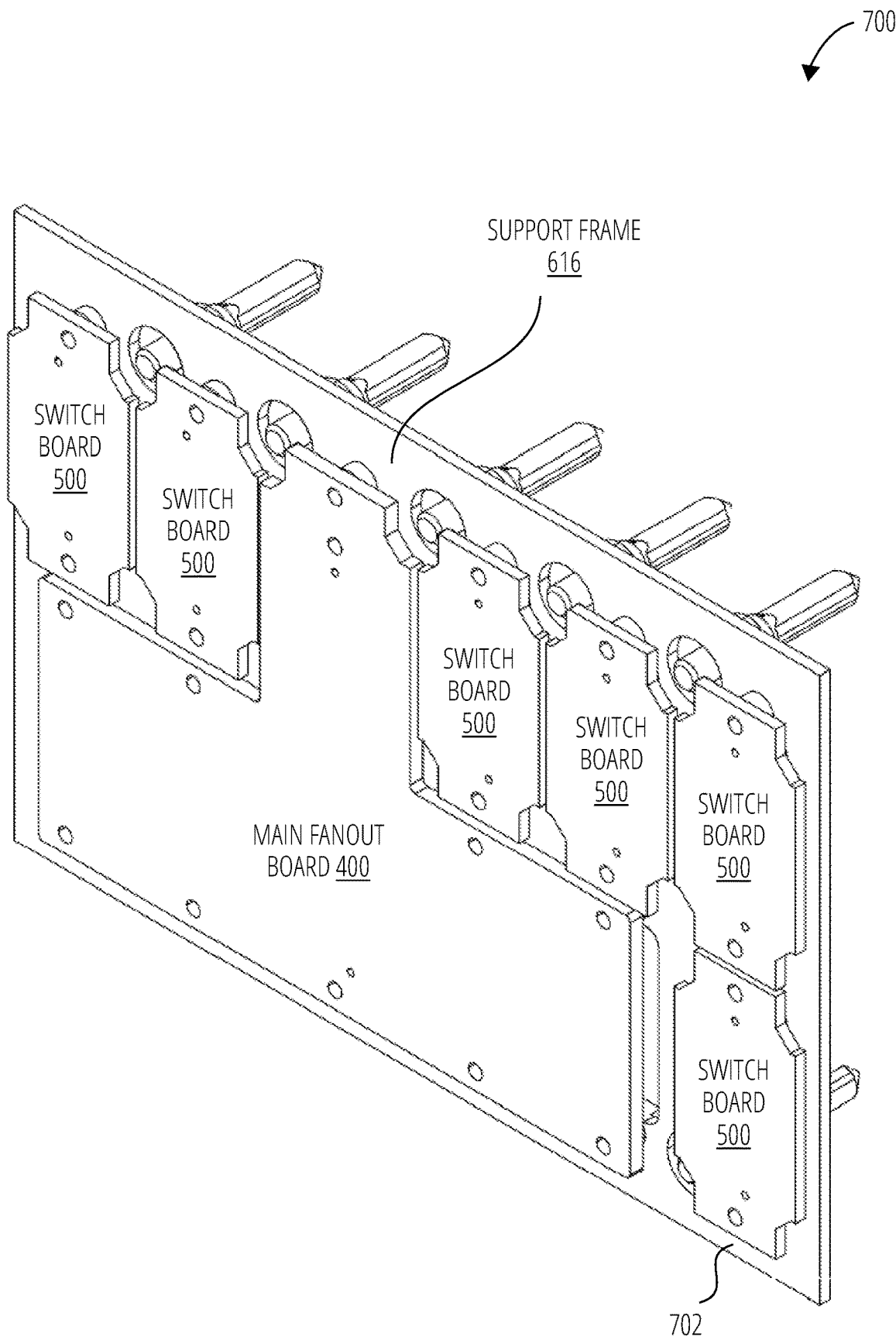
FIG. 7 illustrates a back view of a disaggregated fault tolerant backplane assembly 700 in accordance with one embodiment.

FIG. 7 illustrates a back view of a disaggregated fault tolerant backplane assembly 700 in accordance with one embodiment. The configuration of the support frame 616, main fanout board 400, and switch boards 500 may be seen.

In this example, the right-most slot is an ad hoc daughter card slot 702. Such an ad hoc daughter card slot 702 may accommodate a custom card with internally redundant functionality that takes two fully independent slot power inputs. Hence, two switch boards 500 may be implemented at this slot to provide two independent, redundant switched power rails at one daughter card location. Another implementation of this solution may be a four-slot backplane with this ad hoc daughter card slot 702 removed.

Figure 8:
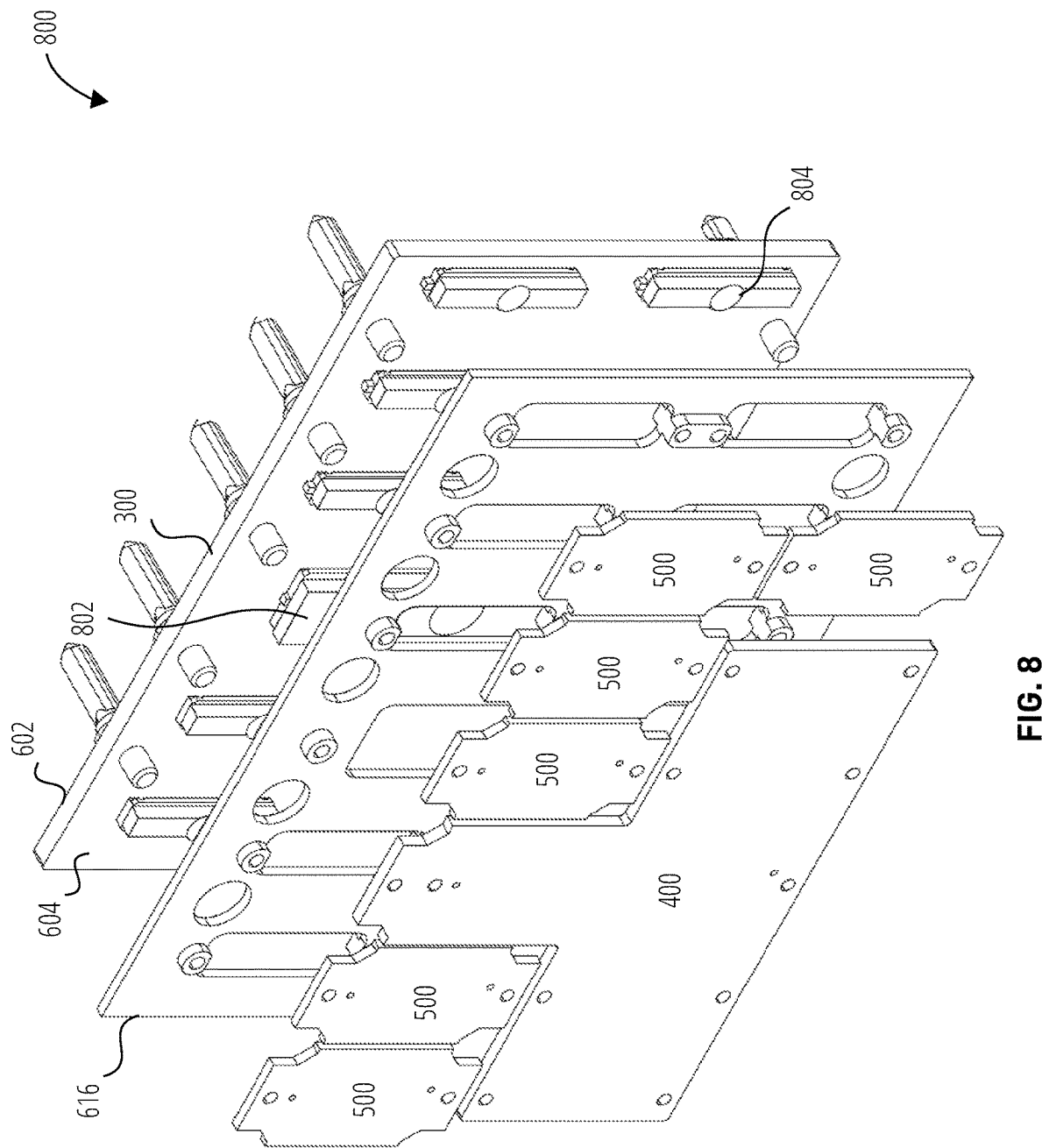
FIG. 8 illustrates a disaggregated fault tolerant backplane assembly 800 in accordance with one embodiment.

FIG. 8 illustrates an exploded back view of a disaggregated fault tolerant backplane assembly 800 in accordance with one embodiment. An MFB connector 802 and SB connectors 804 may be seen on the back side 604 of a disaggregated fault tolerant backplane 300. The support frame 616 may include cutouts allowing the main fanout board 400 and switch boards 500 to connect to the disaggregated fault tolerant backplane 300 via the MFB connector 802 and SB connectors 804, respectively.

Figure 9:
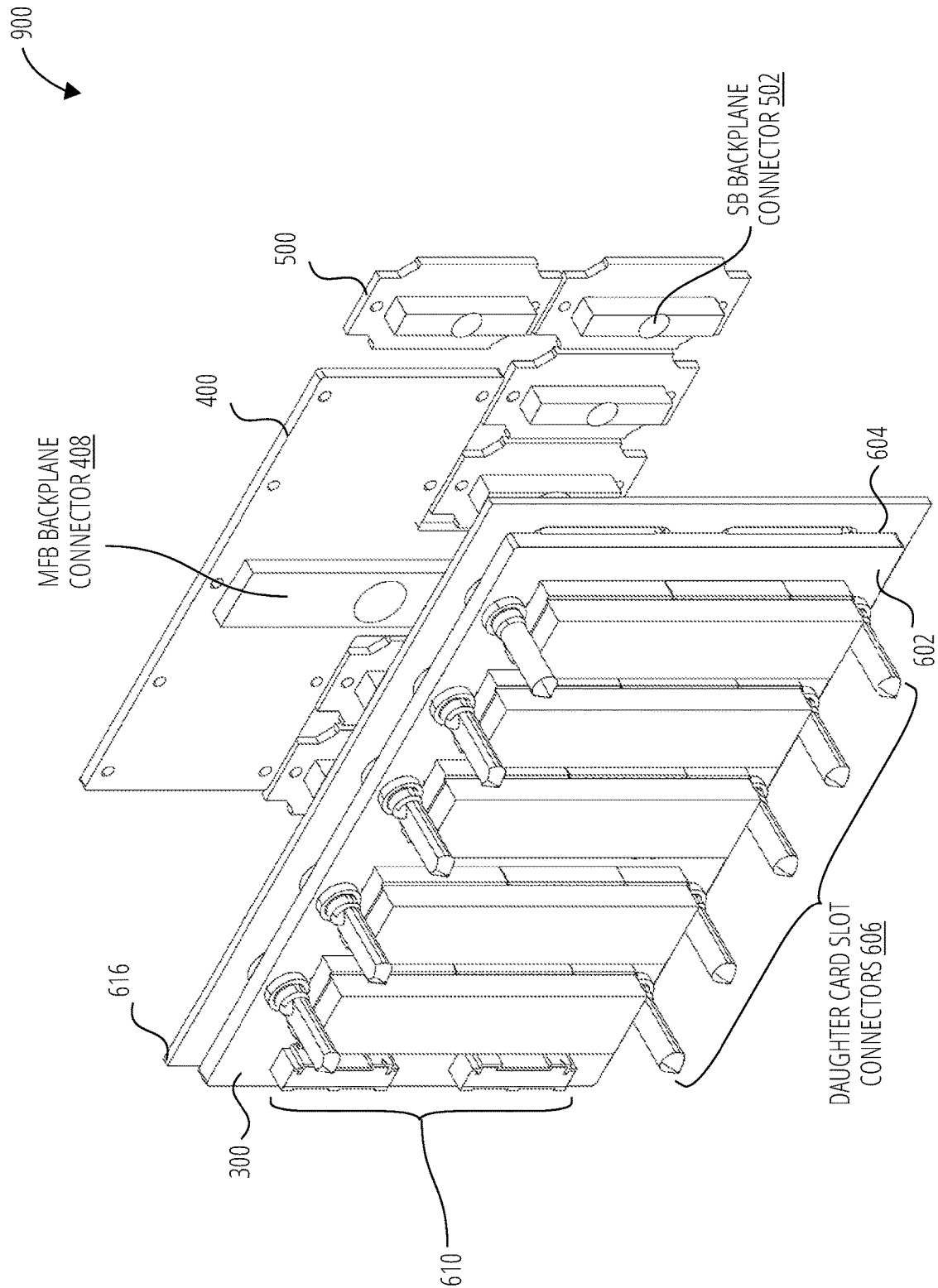
FIG. 9 illustrates an exploded front view of a disaggregated fault tolerant backplane assembly 900 in accordance with one embodiment.

FIG. 9 illustrates an exploded front view of a disaggregated fault tolerant backplane assembly 900 in accordance with one embodiment. In addition to the components visible in FIG. 6, i.e., the disaggregated fault tolerant backplane 300, main fanout board 400, switch board 500, daughter card slot connector 606, and backplane power connector 610, this view further illustrates the MFB backplane connector 408 and SB backplane connectors 502 introduced in FIG. 4 and FIG. 5, respectively. In one embodiment, these may be stacking connectors connecting to the disaggregated fault tolerant backplane 300 via the MFB connector 802 and SB connectors 804 not visible in this view but shown in FIG. 8.

Figure 10:
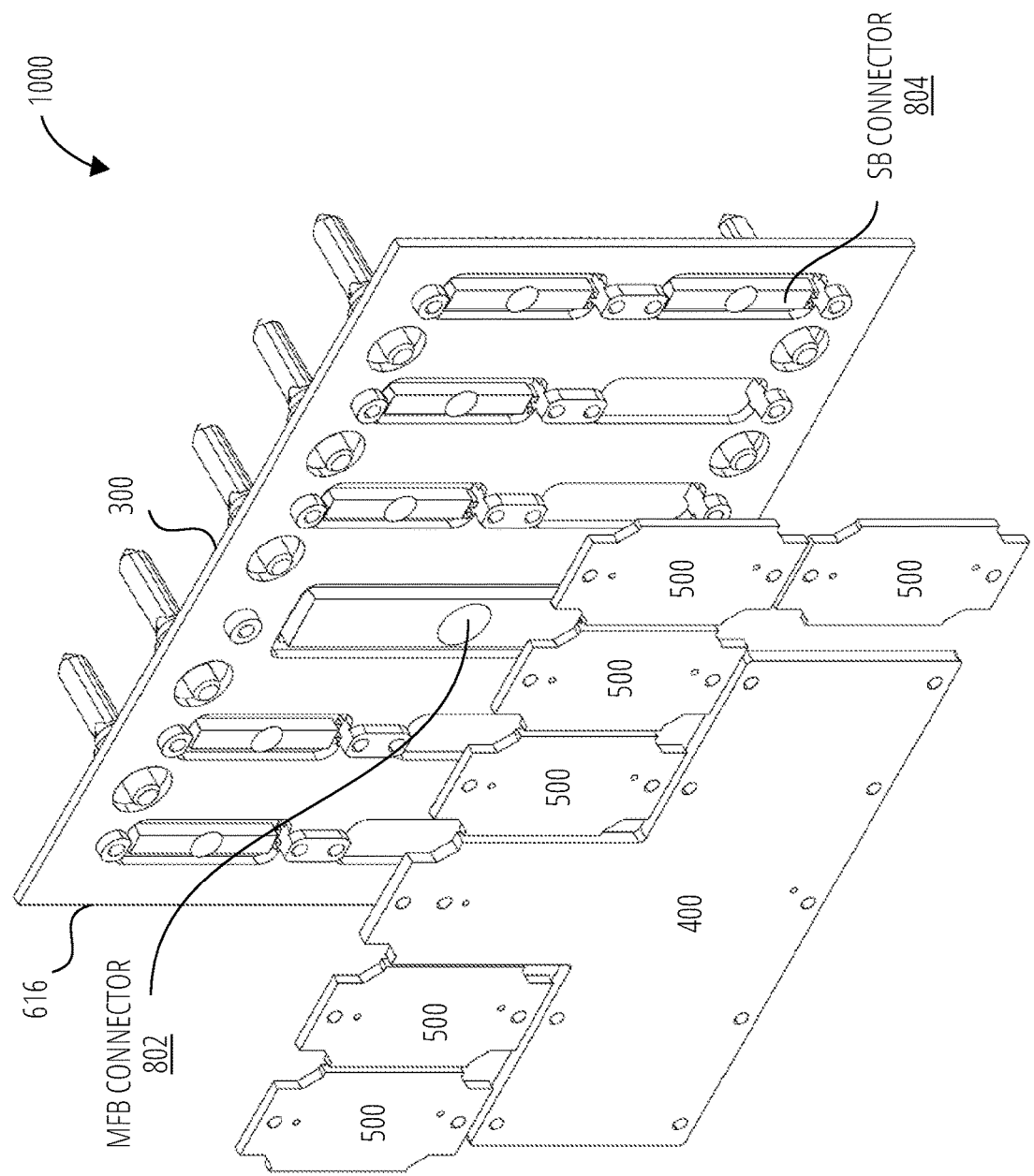
FIG. 10 illustrates an exploded back view of a disaggregated fault tolerant backplane assembly 1000 in accordance with one embodiment.

FIG. 10 illustrates an exploded back view of a disaggregated fault tolerant backplane assembly 1000 in accordance with one embodiment. Here the MFB connector 802 and SB connectors 804 may be seen protruding through the support frame 616. These stacking connectors may mate with the MFB backplane connector 408 and SB backplane connectors 502 illustrated in FIG. 9, respectively.

In one embodiment the stacking height of the SB connector 804 connectors in combination with the SB backplane connector 502 may be as low as is allowed by the height of components on the switch boards 500, within a margin of safety indicated by vibration analysis. In this implementation the stacking height is 7 mm.

Likewise, the stacking height of the MFB connector 802 in combination with the MFB backplane connector 408 may be as low as allowed by the main fanout board 400 component heights and vibration analysis. For simplicity of manufacturing and assembly, this height may be the same as that for the SB connector 804 and SB backplane connector 502. In this implementation the stacking height is 7 mm.

Figure 11:
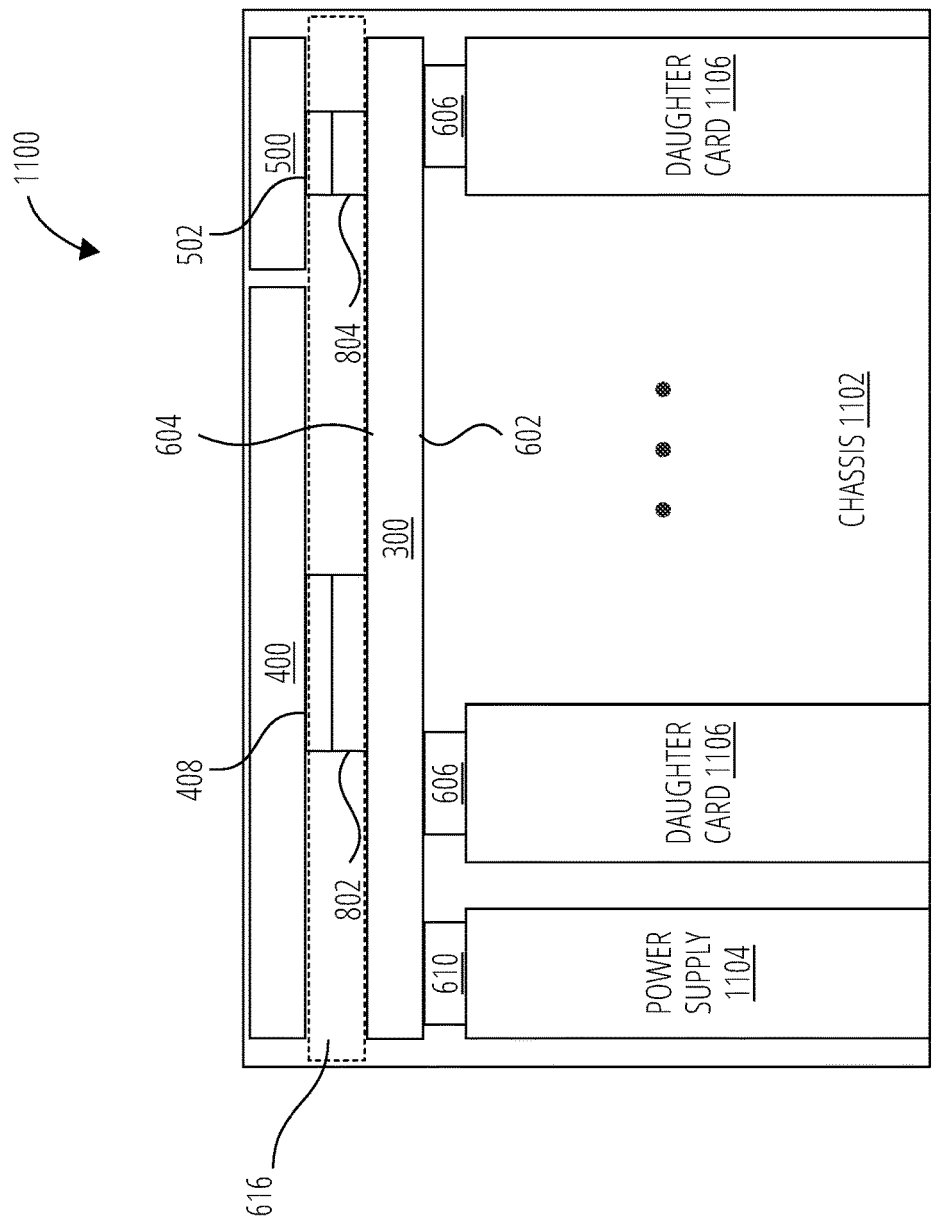
FIG. 11 illustrates a disaggregated fault tolerant backplane system 1100 in accordance with one embodiment.

FIG. 11 illustrates a disaggregated fault tolerant backplane system 1100 in accordance with one embodiment. The disaggregated fault tolerant backplane system 1100 may be implemented in place of the redundant power backplane system 100 illustrated in FIG. 1. The disaggregated fault tolerant backplane system 1100 may comprise a disaggregated fault tolerant backplane 300, a main fanout board 400, an MFB backplane connector 408, a switch board 500, an SB backplane connector 502, a daughter card slot connector 606, a backplane power connector 610, a support frame 616, an MFB connector 802, an SB connector 804, a chassis 1102, a power supply 1104, and a daughter card 1106.

The chassis 1102 may protect all of the other components, which may be disposed within it, and may be held in place with mounting hardware as will be understood by one skilled in the art. The support frame 616 may be fixed to the chassis 1102 and may be rigidly connected to the disaggregated fault tolerant backplane 300 to prevent motion of the disaggregated fault tolerant backplane 300 with respect to the chassis 1102.

The main fanout board 400 and switch boards 500 may connect electrically and mechanically to the disaggregated fault tolerant backplane 300 through cutouts in the support frame 616 as described above. The MFB backplane connector 408 of the main fanout board 400 may mate with the MFB connector 802 on the back side 604 of the disaggregated fault tolerant backplane 300. The switch boards 500 may similarly connect to the disaggregated fault tolerant backplanes 300 by means of the SB backplane connector 502 and the SB connectors 804.

The chassis 1102 may provide mechanical support for power supplies 1104 and daughter cards 1106. The power supplies 1104 may connect to the disaggregated fault tolerant backplane 300 through the backplane power connectors 610 disposed on the front side 602 of the disaggregated fault tolerant backplane 300. The daughter cards 1106 may similarly connect to the disaggregated fault tolerant backplane 300 through the daughter card slot connectors 606 as shown.

FIG. 12 illustrates an eleven slot disaggregated fault tolerant backplane assembly 1200 in accordance with one embodiment. An eleven-slot 3U backplane and support frame 1202 may be configured to support twelve switch boards 500 managed by a main fanout board 400, as shown. Similarly to FIG. 7, FIG. 12 includes an ad-hoc slot on the right with two SBs. This particular example shows the maximum number of slots supported in this implementation of the MFB.

Figure 13:
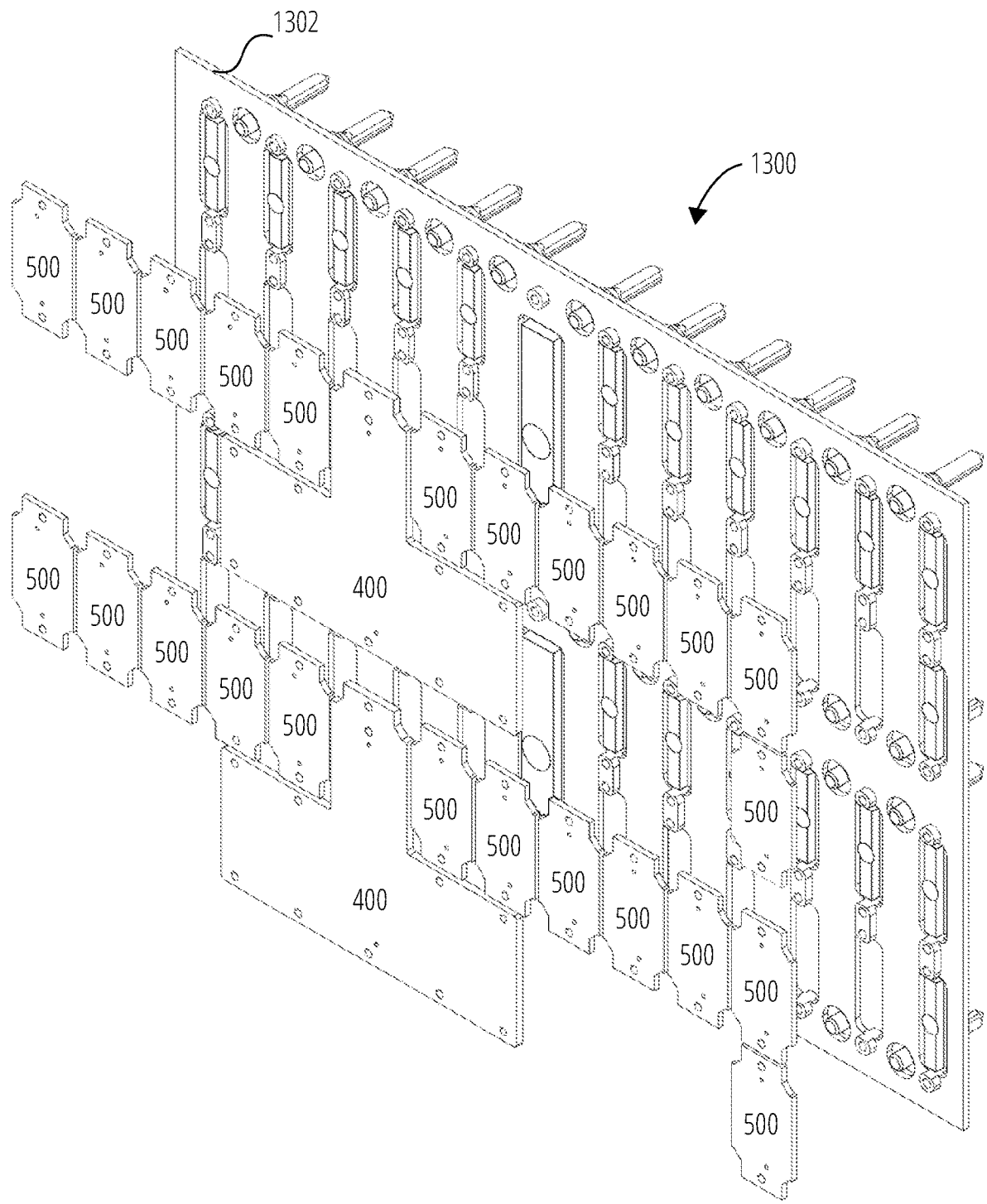
FIG. 13 illustrates a twenty-two slot disaggregated fault tolerant backplane assembly 1300 in accordance with one embodiment.

FIG. 13 illustrates a twenty-two slot disaggregated fault tolerant backplane assembly 1300 in accordance with one embodiment. A twenty-two slot 3U backplane and support frame 1302 may be configured to support twenty-four switch boards 500 managed by two main fanout boards 400. In this case daughter card slots and SBs are arranged in two rows of eleven each to ease signal routing between the slots. This configuration may include two ad-hoc slots on the right, each with two dedicated SBs.

Figure 14:
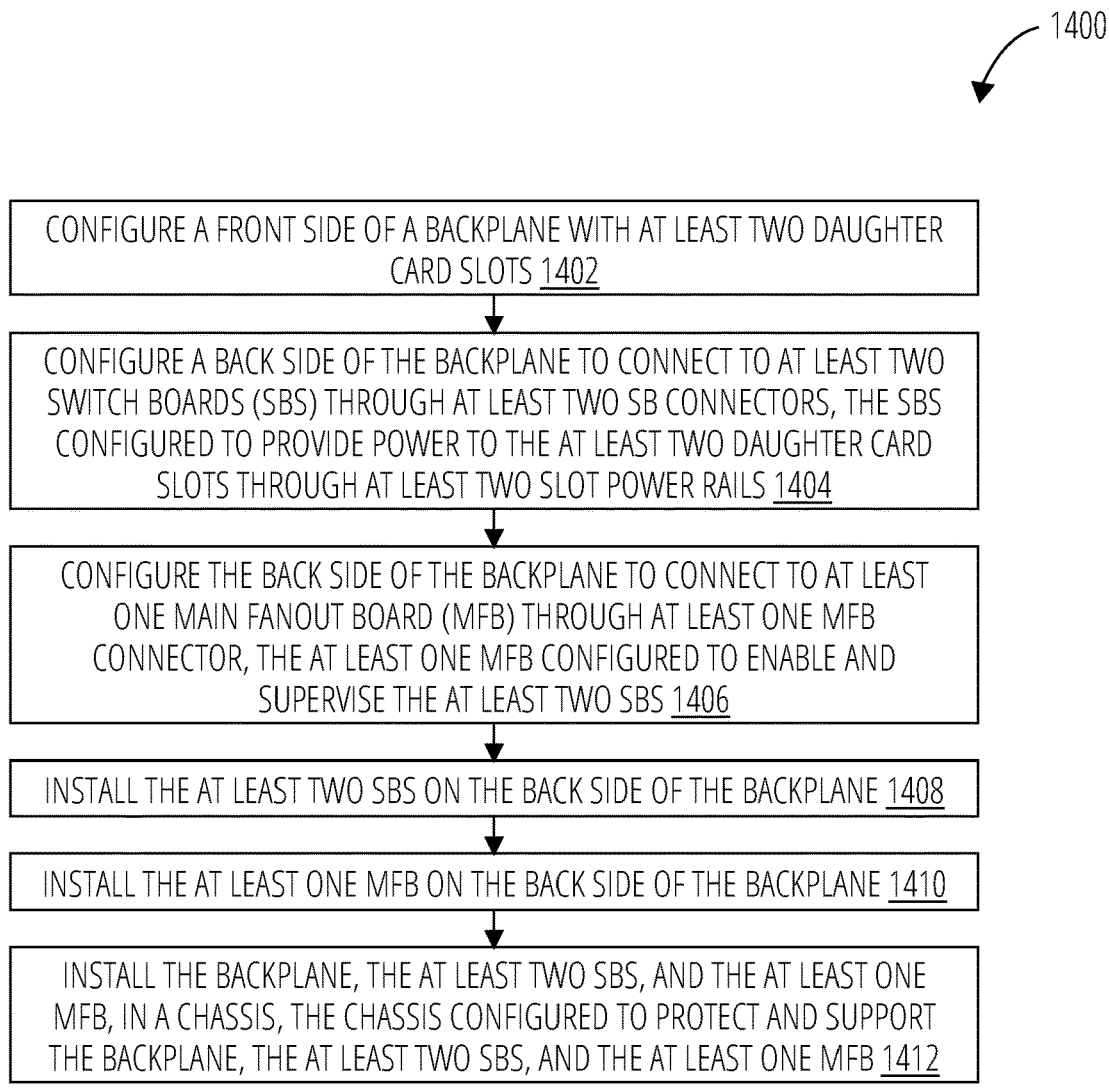
FIG. 14 illustrates a routine 1400 in accordance with one embodiment.

FIG. 14 illustrates a routine 1400 in accordance with one embodiment. In block 1402, a front side of a backplane may be configured with at least two daughter card slots. In block 1404, a back side of the backplane may be configured to connect to at least two switch boards (SBs) through at least two SB connectors. The SBs may be configured to provide power to the at least two daughter card slots through at least two slot power rails.

In block 1406, the back side of the backplane may be configured to connect to at least one main fanout board (MFB) through at least one MFB connector. The at least one MFB may be configured to enable and supervise the at least two SBs.

In block 1408, the at least two SBs may be installed on the back side of the backplane. In block 1410, the at least one MFB may be installed on the back side of the backplane. In block 1412, the backplane, the at least two SBs, and the at least one MFB, may be installed in a chassis. The chassis may be configured to protect and support the backplane, the at least two SBs, and the at least one MFB.

The routine 1400 may in one embodiment include configuring the backplane to connect to a nominal power supply via a backplane nominal power connector, the backplane nominal power connector connecting to nominal power rails that traverse the backplane to the at least two SB connectors and the at least one MFB connector, configuring the backplane to connect to a redundant power supply via a backplane redundant power connector, the backplane redundant power connector connecting to redundant power rails that traverse the backplane to the at least two SB connectors and the at least one MFB connector, connecting the nominal power supply to the backplane nominal power connector, connecting the redundant power supply to the backplane redundant power connector, turning on the nominal power supply, thereby providing nominal power to the nominal power rails, and turning on the redundant power supply, thereby providing redundant power to the redundant power rails.

The routine 1400 may further include configuring the MFB to instruct the at least two SBs to connect one of the nominal power rails and the redundant power rails to the at least two slot power rails through at least one fault tolerant blocking switch, and powering the at least two daughter card slots from the at least two slot power rails.

The routine 1400 may also include connecting at least one daughter card to one of the at least two daughter card slots.

The routine 1400 may further include, on condition that one of the at least two SBs is a nonfunctional SB disabling the nonfunctional SB using the MFB, disconnecting the nonfunctional SB from an associated SB connector, connecting a functional SB to the associated SB connector, and enabling the functional SB using the MFB, and on condition that the at least one MFB is a nonfunctional MFB disconnecting the non-functional MFB from an associated MFB connector, and connecting a functional MFB to the associated MFB connector. Other technical features may be readily apparent to one skilled in the art from the following figures, descriptions, and claims.

Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure may be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" may be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

The apparatus and system in this disclosure are described in the preceding on the basis of several preferred embodiments. Different aspects of different variants are considered to be described in combination with each other such that all combinations that upon reading by a skilled person in the field on the basis of this document may be regarded as being read within the concept of the disclosure. The preferred embodiments do not limit the extent of protection of this document.

Having thus described illustrative embodiments in detail, it will be apparent that modifications and variations are possible without departing from the scope of the disclosure as claimed. The scope of disclosed subject matter is not limited to the depicted embodiments but is rather set forth in the following Claims.

What is claimed is:

1. An apparatus comprising:
 a disaggregated fault tolerant backplane having a front side and a back side, wherein at least two daughter card slots are configured on the front side and configured to send and receive slot fanout signals over the disaggregated fault tolerant backplane;
 at least two switch boards (SBs) configured to provide electrical power to the at least two daughter card slots via slot power rails, wherein the at least two SBs connect to the disaggregated fault tolerant backplane through at least two SB connectors configured on the back side of the disaggregated fault tolerant backplane; and
 at least one main fanout board (MFB) configured to send and receive SB control signals to and from the at least two SBs, wherein the at least one MFB connects to the disaggregated fault tolerant backplane through at least one MFB connector configured on the back side of the disaggregated fault tolerant backplane.

2. The apparatus of claim 1, wherein the at least one MFB is further configured to accept MFB control signals from the at least two daughter card slots.

3. The apparatus of claim 1, wherein the at least one MFB is further configured to send slot fanout signals to the at least two daughter card slots.

4. The apparatus of claim 1, wherein the SB control signals comprise SB switch enable signals and the at least one MFB directs the at least two SBs to provide the electrical power to the at least two daughter card slots.

5. The apparatus of claim 1, the electrical power comprising:
 a nominal power supplying a specified voltage and a specified current; and
 a redundant power supplying the specified voltage and the specified current, wherein in case of a failure of the nominal power, the apparatus continues to function without interruption;
 wherein the nominal power is supplied to the disaggregated fault tolerant backplane, the at least two daughter card slots, the at least two SBs, and the at least one MFB, via nominal power rails and wherein the redundant power is supplied to the disaggregated fault tolerant backplane, the at least two daughter card slots, the at least two SBs, and the at least one MFB, via redundant power rails.

6. The apparatus of claim 5, further comprising:
 a backplane nominal power connector, the backplane nominal power connector configured to connect a nominal power supply to the nominal power rails of the disaggregated fault tolerant backplane, the nominal power supply configured to generate the nominal power;
 and a backplane redundant power connector, the backplane redundant power connector configured to connect a redundant power supply to the redundant power rails of the disaggregated fault tolerant backplane, the redundant power supply configured to generate the redundant power.

7. The apparatus of claim 6, the backplane nominal power connector and the backplane redundant power connector configured on the front side of the disaggregated fault tolerant backplane.

8. A method comprising:
 configuring a front side of a backplane with at least two daughter card slots;
 configuring a back side of the backplane to connect to at least two switch boards (SBs) through at least two SB connectors, the SBs configured to provide power to the at least two daughter card slots through at least two slot power rails;

configuring the back side of the backplane to connect to at least one main fanout board (MFB) through at least one MFB connector, the at least one MFB configured to enable and supervise the at least two SBs;
installing the at least two SBs on the back side of the backplane;
installing the at least one MFB on the back side of the backplane; and
installing the backplane, the at least two SBs, and the at least one MFB, in a chassis, the chassis configured to protect and support the backplane, the at least two SBs, and the at least one MFB.

9. The method of claim 8, further comprising:
configuring the backplane to connect to a nominal power supply via a backplane nominal power connector, the backplane nominal power connector connecting to nominal power rails that traverse the backplane to the at least two SB connectors and the at least one MFB connector;
configuring the backplane to connect to a redundant power supply via a backplane redundant power connector, the backplane redundant power connector connecting to redundant power rails that traverse the backplane to the at least two SB connectors and the at least one MFB connector;
connecting the nominal power supply to the backplane nominal power connector;
connecting the redundant power supply to the backplane redundant power connector;
turning on the nominal power supply, thereby providing nominal power to the nominal power rails; and
turning on the redundant power supply, thereby providing redundant power to the redundant power rails.

10. The method of claim 9, further comprising:
configuring the MFB to instruct the at least two SBs to connect one of the nominal power rails and the redundant power rails to the at least two slot power rails through at least one fault tolerant blocking switch; and
powering the at least two daughter card slots from the at least two slot power rails.

11. The method of claim 8, further comprising:
connecting at least one daughter card to one of the at least two daughter card slots.

12. The method of claim 8, further comprising:
on condition that one of the at least two SBs is a nonfunctional SB:
disabling the nonfunctional SB using the MFB;
disconnecting the nonfunctional SB from an associated SB connector;
connecting a functional SB to the associated SB connector; and
enabling the functional SB using the MFB on condition that the at least one MFB is a nonfunctional MFB:
disconnecting the non-functional MFB from an associated MFB connector; and
connecting a functional MFB to the associated MFB connector.

13. An apparatus comprising:
a backplane having a front side and a back side, the backplane comprising:
a nominal power rail providing electrical power to the backplane;
at least two slot power rails;
at least two switch board (SB) connectors configured on the back side, each connected to the nominal power rail and to one of the slot power rails; and
at least two daughter card slot connectors configured on the front side, each connected to one of the slot power rails and to backplane electrical signals; and
at least two switch boards (SBs) configured to connect to the backplane through the SB connectors, each SB comprising:
a SB nominal power;
a SB output power;
a SB backplane connector connected to the SB nominal power and the SB output power and configured such that mating the SB backplane connector with one of the SB connectors attaches the nominal power rail to the SB nominal power and attaches the SB output power to one of the slot power rails;
at least one nominal SB switch enable signal; and
at least one nominal power fault tolerant blocking switch configured to connect the SB nominal power to the SB output power when closed by the at least one nominal SB switch enable signal, thereby conveying the electrical power from the nominal power rail to one of the at least two daughter card slot connectors.

14. The apparatus of claim 13, further comprising:
at least one main fanout board (MFB) MFB connector configured on the back side of the backplane, the at least one MFB connector connected to the nominal power rail and the backplane electrical signals; and
at least one main fanout board (MFB), the MFB comprising:
a MFB nominal power;
at least one logic fanout controller powered by the MFB nominal power and configured to receive and transmit MFB nominal signals; and
a MFB backplane connector configured to mate with the at least one MFB connector to attach the backplane electrical signals to the MFB nominal signals and to attach the nominal power rail to the MFB nominal power.

15. The apparatus of claim 14, the MFB comprising:
a nominal logic fanout controller configured to receive and transmit MFB nominal signals; and
a redundant logic fanout controller configured to receive and transmit MFB redundant signals;
wherein the nominal logic fanout controller and the redundant logic fanout controller are functionally equivalent.

16. The apparatus of claim 13, further comprising:
a redundant power rail configured on the backplane, wherein the redundant power rail is isolated from and functionally identical to the nominal power rail;
the at least two SB connectors further connected to the redundant power rail;
the at least two SBs each further comprising:
a SB redundant power;
the SB backplane connector further connected to the SB redundant power and configured such that mating the SB backplane connector with one of the SB connectors attaches the redundant power rail to the SB redundant power;
at least one redundant SB switch enable;
at least one redundant power fault tolerant blocking switch configured to connect the SB redundant power to the SB output power when closed by the at least one redundant SB switch enable, thereby conveying the electrical power from the redundant power rail to one of the at least two daughter card slot connectors.

17. The apparatus of claim 16, further comprising:
at least one main fanout board (MFB) connector configured on the back side of the backplane, the at least one MFB connector connected to the nominal power rail, the redundant power rail, and the backplane electrical signals, wherein the backplane electrical signals comprise backplane nominal signals and backplane redundant signals; and
at least one main fanout board (MFB), the MFB comprising:
 a MFB nominal power;
 a MFB redundant power;
 a nominal logic fanout controller powered through a nominal power regulator and nominal power protection and configured to receive and transmit MFB nominal signals, wherein the nominal power regulator is configured to regulate the MFB nominal power and the nominal power protection is configured to protect the nominal logic fanout controller from faults in the MFB nominal power;
 a redundant logic fanout controller powered through a redundant power regulator and a redundant power protection and configured to receive and transmit MFB redundant signals, wherein the redundant power regulator is configured to regulate the MFB redundant power and the redundant power protection is configured to protect the redundant logic fanout controller from faults in the MFB redundant power;
 wherein the nominal logic fanout controller and the redundant logic fanout controller are functionally equivalent; and
 a MFB backplane connector configured to mate with the at least one MFB connector to attach the backplane nominal signals to the MFB nominal signals, to attach the backplane redundant signals to the MFB redundant signals, to attach the nominal power rail to the MFB nominal power, and to attach the redundant power rail to the MFB redundant power.

18. The apparatus of claim 17, the MFB further including cross-strapping circuitry, the cross-strapping circuitry controlled by at least one of the nominal logic fanout controller and the redundant logic fanout controller, the cross-strapping circuitry providing a path to selectively drive at least one of the MFB nominal signals from the redundant logic fanout controller and the MFB redundant signals from the nominal logic fanout controller.

19. The apparatus of claim 17, the MFB further including:
 a nominal supervision circuit, the nominal supervision circuit receiving MFB nominal power through the nominal power regulator and the nominal power protection, the nominal supervision circuit sending nominal supervisory signals to the nominal logic fanout controller and the redundant logic fanout controller; and
a redundant supervision circuit, the redundant supervision circuit receiving MFB redundant power through the redundant power regulator and the redundant power protection, the redundant supervision circuit sending redundant supervisory signals to the redundant logic fanout controller and the nominal logic fanout controller.

20. The apparatus of claim 17, The MFB further comprising:
 a nominal isolation switch configured to connect the redundant logic fanout controller to the MFB nominal power when closed, the nominal isolation switch controlled by the nominal logic fanout controller;
 a redundant isolation switch configured to connect the nominal logic fanout controller to the MFB redundant power when closed, the redundant isolation switch controlled by the redundant logic fanout controller;
 a nominal isolation diode configured to block current flow from the MFB nominal power to the redundant power rail when the redundant isolation switch is closed;
 a redundant isolation diode, the redundant isolation diode configured to block current flow from the MFB redundant power to the nominal power rail when the nominal isolation switch is closed;
 a nominal rail blocking diode, the nominal rail blocking diode configured to block current flow from the MFB redundant power to the nominal power rail when the redundant isolation switch is closed; and
 a redundant rail blocking diode, the redundant rail blocking diode configured to block current flow from the MFB nominal power to the redundant power rail when the nominal isolation switch is closed.

21. An apparatus comprising:
 a disaggregated fault tolerant backplane having a front side and a back side, wherein at least two daughter card slots are configured on the front side and configured to send and receive slot fanout signals over the disaggregated fault tolerant backplane;
 at least two switch boards (SBs) configured to provide electrical power to the at least two daughter card slots via slot power rails,
  wherein the at least two SBs connect to the disaggregated fault tolerant backplane through at least two SB connectors configured on the back side of the disaggregated fault tolerant backplane, and
  wherein the electrical power comprises:
 a nominal power supplying a specified voltage and a specified current; and
 a redundant power supplying the specified voltage and the specified current, wherein in case of a failure of the nominal power, the apparatus continues to function without interruption; and
 at least one main fanout board (MFB) configured to send and receive SB control signals to and from the at least two SBs, wherein the at least one MFB connects to the disaggregated fault tolerant backplane through at least one MFB connector configured on the back side of the disaggregated fault tolerant backplane.

* * * * *